United States Patent [19]

Wu et al.

[11] Patent Number: 5,843,870
[45] Date of Patent: Dec. 1, 1998

[54] ALKALINE-DOPED MERCURY CUPRATE SUPERCONDUCTORS

[75] Inventors: Judy Z. Wu; Sehwan Yoo, both of Lawrence, Kans.

[73] Assignee: The University of Kansas, Lawrence, Kans.

[21] Appl. No.: 775,359

[22] Filed: Jan. 3, 1997

[51] Int. Cl.$^6$ .............................. H01L 39/12; C04B 35/01
[52] U.S. Cl. ............................................. 505/125; 505/776
[58] Field of Search .................................... 505/100, 120, 505/125, 783, 776; 252/521.1

[56] References Cited

U.S. PATENT DOCUMENTS

| | | | |
|---|---|---|---|
| 5,300,482 | 4/1994 | Doi et al. | 505/120 |
| 5,332,721 | 7/1994 | Xin et al. | 505/492 |
| 5,401,713 | 3/1995 | Torii | 505/120 |

OTHER PUBLICATIONS

Dou et al.; Melt processing of alkali element doped $Bi_2Sr_2CaCu_2O_8$; Physica C 172 (1990) 295–303 (No Month).

Moehlecke et al.; Enhancement of the intergranular superconducting properties in $Bi_2Sr_2CaCu_2O_8$ with Li additions; Physica C 211 (1993) 113–120.

Andersson–Fäldt et al.; Superconductivity of electrochemically lithiated $YBa_2Cu_3O_{7-\delta}$ thin films; Physica C 226 (1994) 143–146 (No Month).

Wu et al.; Superconducting properties and microstructural evolution; Physica C 246 (1995) 297–308 (No Month).

Matsubara et al.; Effects of Li doping on the superconducting properties of Bi–based superconducting whiskers; Physica C 201 (1992) 83–94 (No Month).

Matsubara et al.; Flexible superconducting whiskers of the Li–doped Bi–Sr–Ca–Cu oxide; Appl. Phys. Lett. 56 (21) 21 May 1990 (No Month).

Horiuchi et al.; Li substitution in the $Bi_2Sr_2Ca_1Cu_2O_2$ superconductor; Physica C 168 (1990) 309–314 (No Month).

Kawai et al.; Effect of alkaline metal substitutions to Bi–Sr–Ca–Cu–O superconductor; Physica C 161 (1989) 561–566 (No Month).

Sun et al. "$T^c$ enhancement of $HgBa_2Ca_2Cu_3O_{8+\delta}$ by Tl Substitution" *Physics Lett, A*, 192 (Aug. 1994) pp. 122–124.

*Primary Examiner*—Mark Kopec
*Attorney, Agent, or Firm*—Hovey, Williams, Timmons & Collins

[57] ABSTRACT

Alkaline-doped superconductors of the formula $$X\ M_2Ca_2Cu_3O_{8+\alpha}$$

are provided where X is selected from the group consisting of Tl, Pb, Mo, Hg and mixtures thereof, M is selected from the group consisting of Ba, Sr and mixtures thereof, and a ranges from zero to about 0.2, and being doped with a dopant selected from the group consisting of Na and Li up to a level of up to about 12% molar ratio, based upon the amount of the element X taken as 100%. The superconductors of the invention exhibit extremely high $T_{c\ onset}$ and $T_{cO}$ values and have high $J_c$ properties as well. The superconductors can be fabricated at relatively low annealing temperatures (750°–820° C.) making them suitable for use as thin films with a variety of conventional substrates.

5 Claims, 9 Drawing Sheets

ALKALINE-DOPED MERCURY CUPRATE SUPERCONDUCTORS

BACKGROUND OF THE INVENTION

1. Field of the Invention

The present invention is concerned with alkaline (Na and Li) doped 1223 superconductors which have record high $T_{c\;onset}$ values and which can be fabricated at low annealing temperatures permitting their use as thin films on a wide variety of substrates. More particularly, the invention pertains to alkaline-doped superconductors of the formula $$X\;M_2Ca_2Cu_3O_{8+\alpha}$$

where X is selected from the group consisting of Tl, Pb, Mo, Hg and mixtures thereof, M is selected from the group consisting of Ba, Sr and mixtures thereof, and α ranges from zero to about 0.2, and being doped with a dopant selected from the group consisting of Na and Li up to a level of up to about 12%, based upon the amount of the element X taken as 100%.

2. Description of the Prior Art

Element doping in superconducting material systems has been explored since the discovery of high temperature superconducting oxides. In recent years, Hg-based cuprates ($HgBa_2Ca_{n-1}Cu_nO_{2n+2+\alpha}$, n=1,2,3,4) have been discovered having very high transit on temperatures on the order of 135K. Accordingly, the chemical doping effect of many different elements in these cuprates has been studied so as to explore the possibility of obtaining superconductivity at even higher temperatures. Thus, Hg has been replaced by Re, Mo, Pb and Tl, and Ba has been replaced by Sr. However, with a few exceptions most of these replacements have resulted in the reduction of $T_c$ values.

In all of these studies, the concept is generally to replace an existing element by another which has a similar atomic radius and the same valence so that a similar crystalline structure plus a slightly perturbed electronic structure can be achieved.

Chemical doping using elements with dramatically different atomic radii and different valences from that of Hg and Ba, presents a significant departure from the prior art. For example, because the alkaline elements possess significant size and valence differences as compared to the heavy elements such as Hg or Ba, it has generally been believed that the alkaline elements cannot enter the lattice sites of Hg-based cuprates.

It is also known that the formation of 1223 phase cuprates requires processing (annealing) temperatures above 870° C. In the context of Hg-1223 superconductors, such high temperature annealing is also carried out in the presence of Hg vapor. Fabrication of Hg-1223 thin films thus is extremely difficult and film-substrate interface chemical reactions at these severe processing conditions are significant. Up until the present time, only $SrTiO_3$ and $LaAlO_3$ substrates have been used successfully with Hg-based cuprate thin films. It is believed that if Hg-based cuprates are to achieve commercial use as thin films on substrates, the severe processing conditions and consequent superconductor/substrate interface problems must be overcome.

SUMMARY OF THE INVENTION

The present invention overcomes the problems outlined above and provides improved alkaline-doped superconductors having very high $T_{c\;onset}$ and $T_{cO}$ critical temperatures which can be produced using a relatively low temperature annealing process making the superconductors suitable for use as thin films applied to substrates. More particularly, the invention relates to alkaline-doped superconductors of the formula $$X\;M_2Ca_2Cu_3O_{8+\alpha}$$

where X is selected from the group consisting of Tl, Pb, Mo, Hg and mixtures thereof, M is selected from the group consisting of Ba, Sr and mixtures thereof, and α ranges from zero to about 0.2, and being doped with a dopant selected from the group consisting of Na and Li up to a level of up to about 12% molar ratio, based upon the amount of the above formula taken as 100%. Superconductors in accordance with the invention have $T_{c\;onset}$ values in excess of 140K, and further exhibit relatively high irreversibility lines, which is consistent with very high $J_c$ values.

In preferred forms, the superconductors of the invention are of the formula $Hg\;Br_2Ca_2Cu_3O_{8+\alpha}$, and the dopant level is from about 0.01–12%, most preferably about 10%. The most preferred dopant is sodium.

The alkaline-doped superconductors of the invention can be formed as bulk superconductors or as thin films onto conventional substrates. In the latter case, the low annealing temperatures of the invention permit fabrication of thin films on a wide variety of substrates. The superconductors hereof are also of high purity. Generally speaking, they are at least about 90% pure 1223 phase, and more preferably at least about 95% pure 1223 phase.

The superconductors of the invention are prepared by first mixing together stoichiometric amounts (based upon the cations) of compounds of M, Ba, Cu and the dopant, generally the oxides and salts of these elements. The mixture is then sintered at a temperature of from about 700°–1000° C. (more preferably from about 800°–950° C.) in an oxygen-rich (i.e., at least about 80% oxygen) environment for a period of from about 10–30 hours (more preferably from about 20–30 hours) to form a sintered non-superconducting precursor. In the case of the most preferred superconductor, wherein the dopant is sodium and M is Ba, the precursor would have a nominal composition of $Na_yBa_2Ca_2Cu_3O_x$ where y ranges from about 0.01–0.12 and x is an unknown oxygen factor.

In the next step, a stoichiometric compound of X is added to the sintered precursor with mixing to assure homogeneity. In the case of the most preferred superconductor, where X is Hg, the preferred compound is HgO. The mixture is then initially annealed at a temperature of from about 750°–820° C. (more preferably from about 760°–810° C.) for period of from about 1–15 hours to form a superconductor.

In order to achieve the highest $T_{c\;onset}$ and $T_c$ values, the initially annealed superconductor is subjected to a secondary annealing step in a flowing oxygen atmosphere. Such secondary annealing is generally conducted at a temperature of from about 200°–400° C. (more preferably from about 275°–350° C.) for a period from about 1–15 hours depending upon sample size.

The impact of alkaline-doping in the preferred Hg-1223 superconductors is dramatic. Such superconductors have significant applicability in micro-electronic devices because of their record high $T_c$ values and relatively high irreversibility lines. Heretofore, fabrication of Hg-1223 films have been extremely difficult owing to the high volatility of Hg-based compounds. Moreover, undoped Hg-1223 superconductors require annealing temperatures above 860° C. under high Hg vapor pressures. These conditions cause severe superconducting film/substrate interface chemical diffusion problems even on the best substrate ($SrTiO_3$). Many desirable substrates such as sapphire, garnet and the like are excluded when using undoped Hg-1223 superconductors because of these problems. However, the present discovery that annealing temperatures can be reduced without the need for high Hg vapor pressures will permit production of the desirable high $T_c$ film products using the heretofore unavailable substrates.

DETAILED DESCRIPTION OF THE PREFERRED EMBODIMENT

Figure 1:
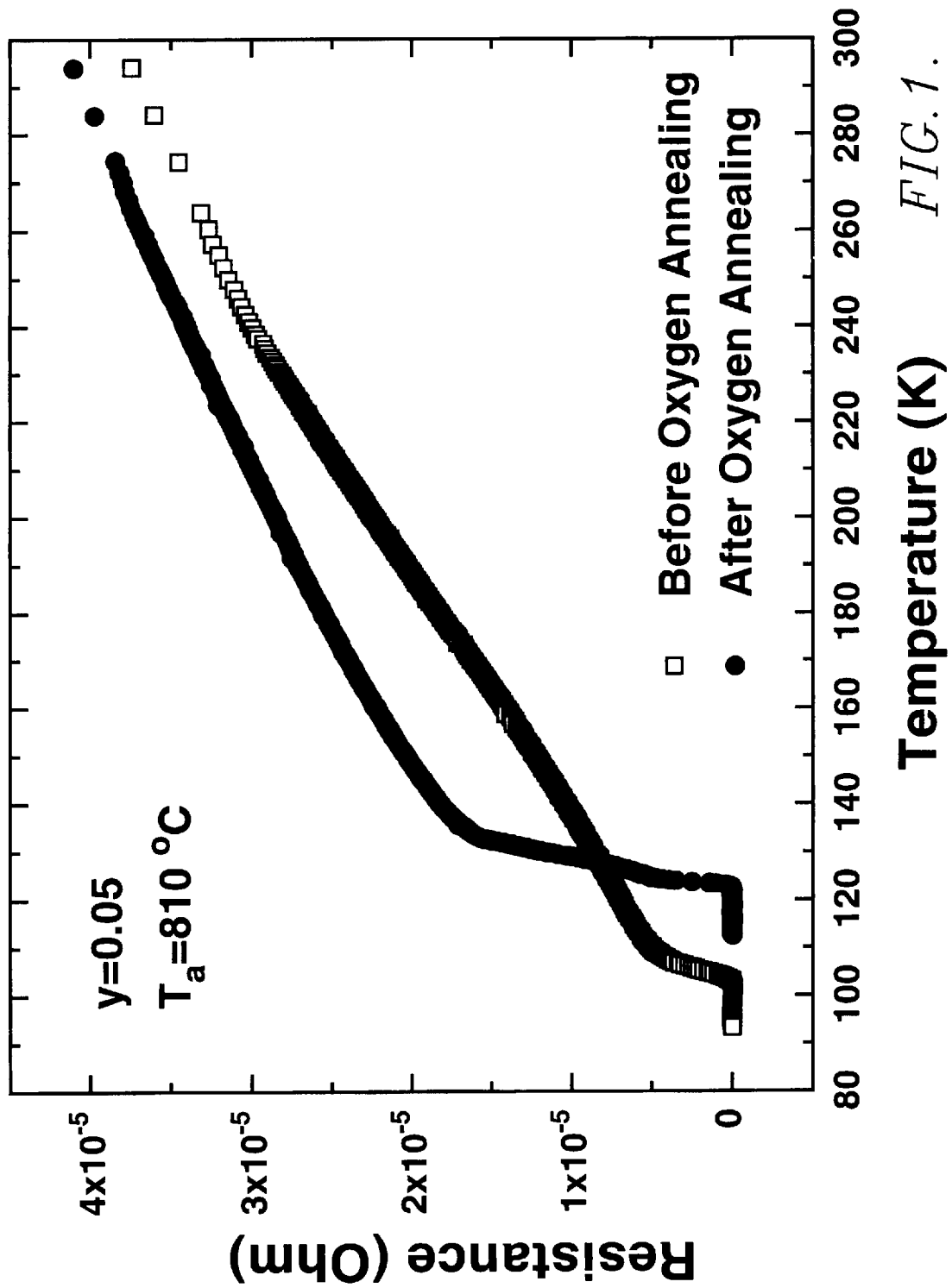
FIG. 1 is a resistivity vs. temperature graph illustrating the $T_{c\ onset}$ and $T_{cO}$ values for a 5% Na-doped Hg-1223 superconductor in accordance with the invention, produced using an initial annealing temperature of 810° C., and after a second oxygen annealing at 350° C.

The following Example sets forth presently preferred alkaline-doped superconductors and methods of fabrication thereof. It is to be understood that these examples are provided by way of illustration only, and nothing therein should be taken as a limitation upon the overall scope of the invention.

EXAMPLE

In this example, a series of sodium-doped Hg-1223 bulk superconductors were fabricated. A two-step process was employed for making of the samples. First a precursor of nominal composition $Na_yBa_2Ca_2Cu_3O_x$ was made from a mixture of NaCl, $Ba(NO_3)_2$, CaO and CuO powders with molar ratio of Na:Ba:Ca:Cu equals y:2:2:3. y was chosen to be 0.05, 0.1, 0.15 and 0.2, based upon the ultimate amount of Hg to be used taken as 1. The powders were thoroughly ground, mixed and then fired at 900° C. for 1000 min. in a tube furnace in the presence of flowing oxygen. The tube furnace was heated from atmospheric to 900° C. at a rate of about 1° C./min. The pressure within tube furnace during the 1000 min. sintering step was maintained at approximately 1 atmosphere. At the end of the sintering period, the heating of the tube furnace was stopped and was cooled at a rate of about 5° C./min., with constant oxygen flow through the tube furnace, until ambient temperature was reached.

The sintered precursor was then reground and mixed with HgO powder in a cation ratio of $(Hg_{1-y}Na_y)$:Ba:Ca:Cu equals 1:2:2:3 and the mixture was then manually pressed into a 12 mm diameter pellet using a laboratory press. In order to reduce the possible detrimental effect of moisture and $CO_2$ in the air, the mixing and grinding steps were carried out in a plastic bag filled with pure Ar gas.

The pressed pellet was next encapsulated into a pre-cleaned and evacuated quartz tube (I.D. =0.5 in with a length of 1.5–2 in.) which was enclosed in a steel cylinder for protection. The ends of the steel tube were closed to form a sample assembly. The sample assembly was then placed in a tube furnace and was subjected to a rapid heating rate of 50° C./min. in order to bring the sample temperature from room temperature to a desired initial annealing temperature ranging from ,750°–870° C. The rapid heating rate was adopted so as to reduce the formation of $HgCaO_2$ in the sample. Once the desired annealing temperature was reached, the temperature was maintained for 10 hrs. Thereafter, the furnace was set for a cool-down rate of 2.5° C./min. for cooling of the sample to ambient temperature.

At this point, certain of the samples were tested for $T_c$ values (resistivity versus temperature curves), magnetization as a function of temperature and applied magnetic field, and by X-ray crystallography. This was to provide a comparison between the samples at this stage in the preparation and the final samples after oxygen annealing.

The Hg-annealed samples Were then placed in the quartz tube for secondary oxygen annealing in the tube furnace. The oxygen annealing step involved heating the sample in the quartz tube to approximately 350° C. at a rate of 10° C./min., followed by maintenance of the oxygen annealing temperature for 10 hrs. During this procedure oxygen was passed through the quartz tube and the pressure within the tube was maintained at about 1 atmosphere. Thereafter, the furnace was cooled at a rate of about 10° C./min., with continued oxygen flow until ambient temperature was reached. The completed bulk superconductor was then removed from the quartz tube.

Figure 2:
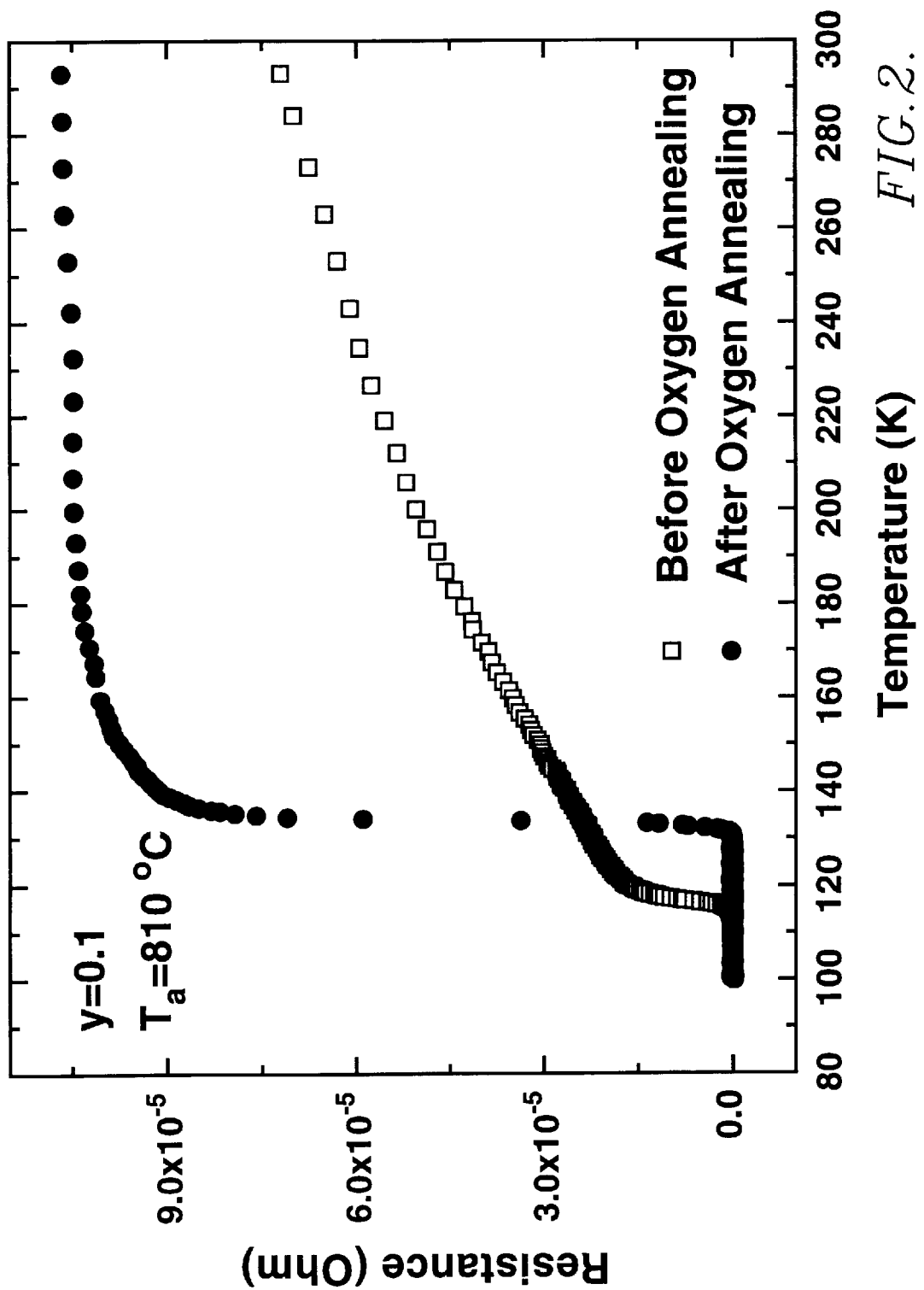
FIG. 2 is a resistivity vs. temperature graph illustrating the $T_{c\ onset}$ and $T_{cO}$ values for a 10% Na-doped Hg-1223 superconductor in accordance with the invention, produced using an initial annealing temperature of 810° C., and after a second oxygen annealing at 350° C.

The finished samples were then tested for $T_c$ and magnetization values, and also subjected to additional X-ray crystallography examinations. FIGS. 1 and 2 illustrate the temperature dependence of resistivity in the Hg-1223 samples with y=0.05 and 0.1, respectively, both before and after oxygen annealing (Hg annealing temperature of 810° C.). These graphs demonstrate that both samples experienced a superconducting transition at above 100K before oxygen annealing (about 109K for y=0.05 and near 120K for y =0.1). The zero resistance is achieved at 105K for y=0.05 and at 115K for y=0.1.

After oxygen annealing, the y=0.05 samples exhibited two transitions, one at 137K and the other at 125K, and a zero resistance temperature of 123K. The y=0.1 samples exhibited only a single transition at around 143K and a zero resistance temperature at about 131K. Additional y=0.1 samples gave an onset $T_c$ in the range of 141–147K and a zero resistance $T_c$ of 131∝136K.

FIGS. 1–2 also show that the resistivity of both samples have metallic linear temperature dependencies before oxygen annealing. $\rho$ (300K)/$\rho$ (150K) is about 3.29 for y=0.05 and about 2.09 for y=0.1. The former is similar to the reported value for undoped Hg-1223. After oxygen annealing however, this ratio becomes 2.14 for y=0.05 and 1.08 for y=0.1. Moreover, the resistivity in both cases increases after oxygen annealing. These results differ from literature reported observations of undoped Hg-1223 phase superconductors where $\rho$ versus T curves become steeper and resistivity values decrease after oxygen annealing.

Figure 3:
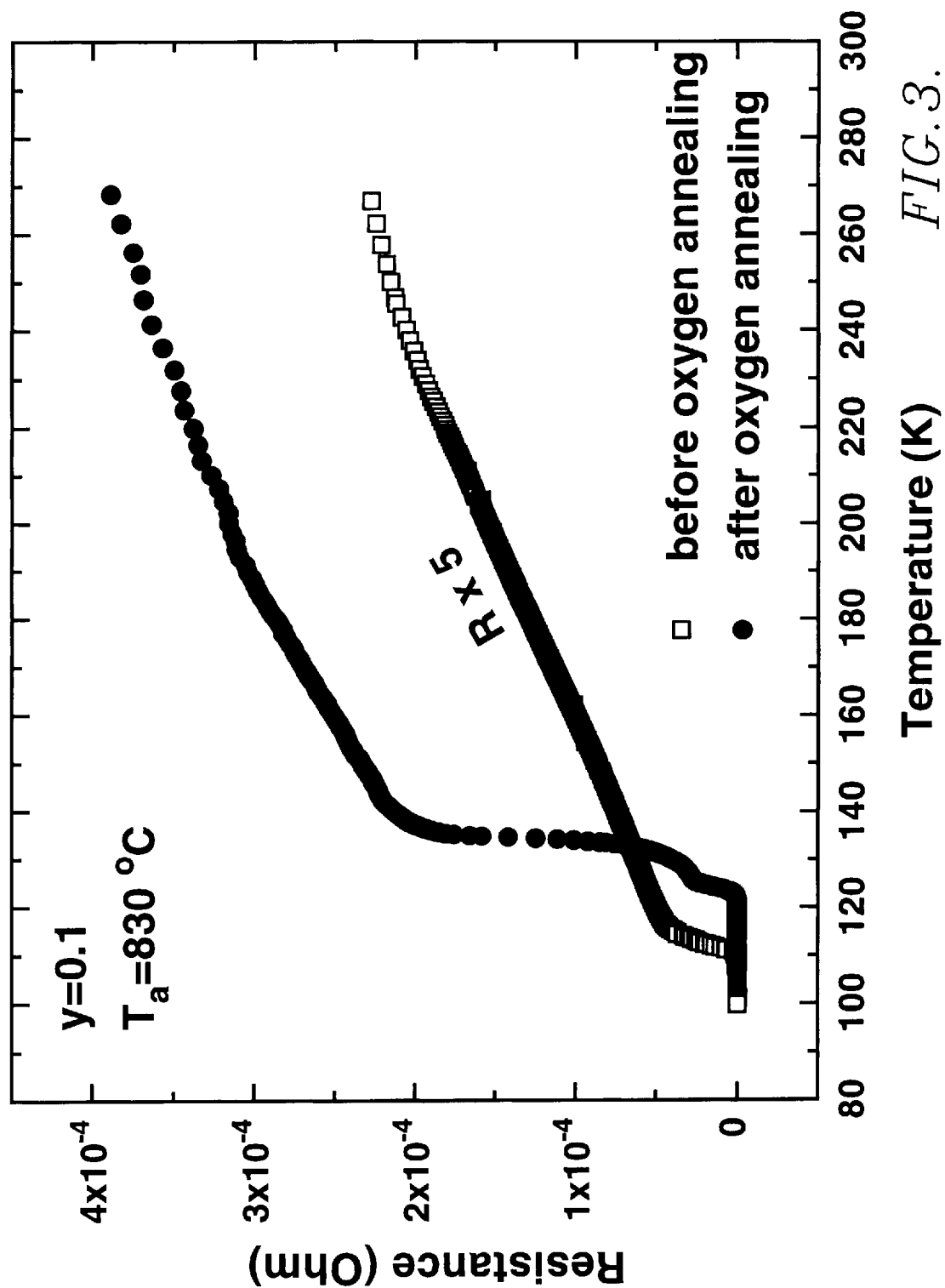
FIG. 3 is a resistivity vs. temperature graph illustrating the $T_{c\ onset}$ and $T_{cO}$ values for a 5% Na-doped Hg-1223 superconductor in accordance with the invention, produced using an initial annealing temperature of 830° C., and after a second oxygen annealing at 350° C.
Figure 4:
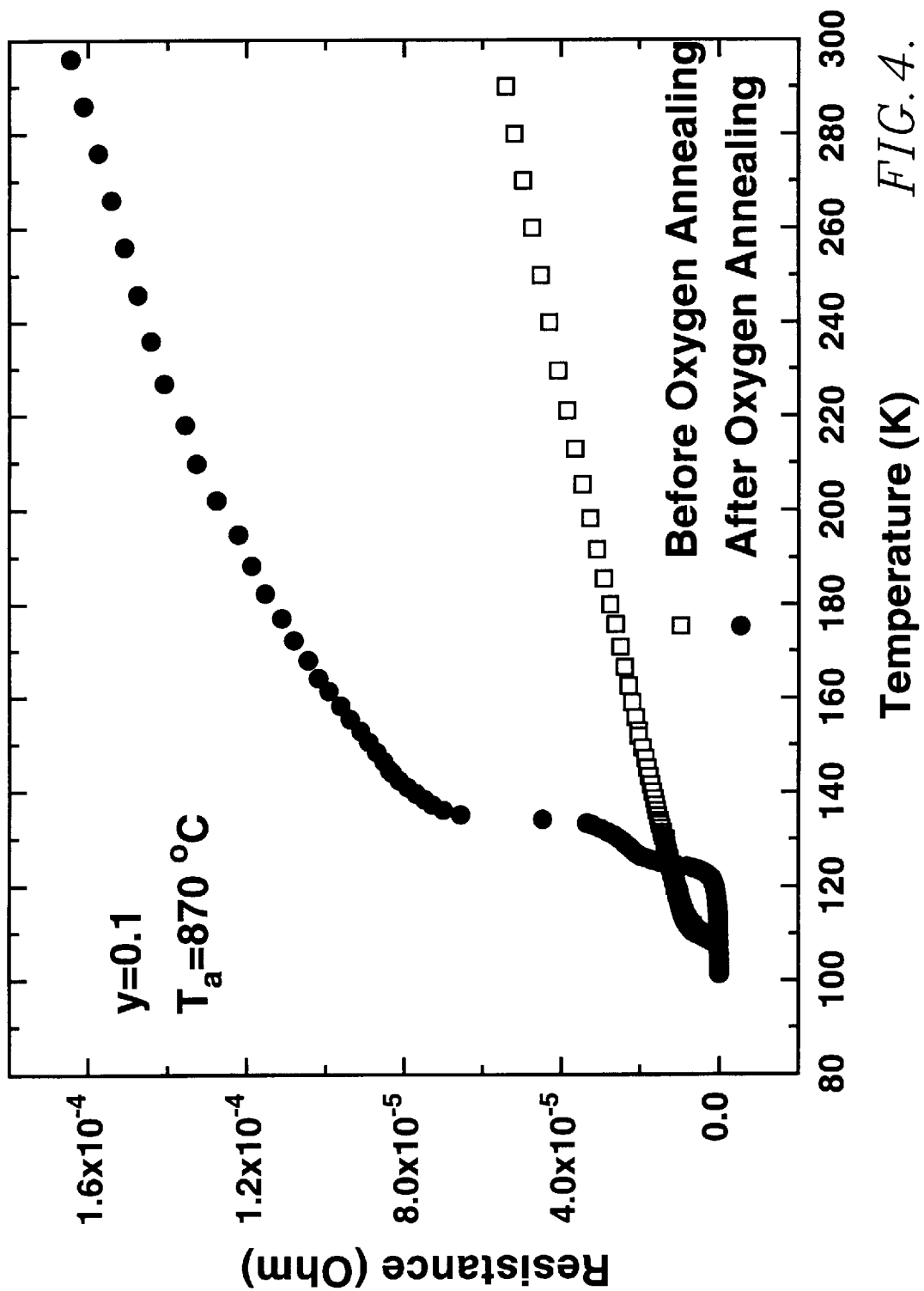
FIG. 4 is a resistivity vs. temperature graph illustrating the $T_{c\ onset}$ and $T_{cO}$ values for a 5% Na-doped Hg-1223 superconductor in accordance with the invention, produced using an initial annealing temperature of 870° C., and after a second oxygen annealing at 350° C.

FIGS. 3–4 illustrate the resistance versus temperature curves for sodium-doped Hg-1223 samples (y=0.1) sintered at different Hg annealing temperatures, namely 830° C. (FIG. 3) and 870° C. (FIG. 4), both before and after oxygen annealing at 350° C. This data and that of FIG. 2 established that the normalstate resistivity increases after oxygen annealing. The slopes of the R versus T curves increase with annealing temperature $T_a$. For example, for $T_a$=830° C., $\rho$ (300K)/$\rho$ (150K) is about 2.91 and 1.88 before and after oxygen annealing, whereas for $T_a$=870° C., this ratio is about 3.3 and 2.05 before and after oxygen annealing. At $T_a$=810° C., only one phase is observed to be superconducting above 130K for y=0.1 as shown in FIG. 2. When $T_a$ is increased, the second phase is formed which has a lower $T_c$ (around 125K) as indicated by the knee in the R versus T curves (after oxygen annealing) in FIGS. 3 and 4. This results is unexpected, however, because oxygen annealing at low temperatures would not normally be expected to give phase decomposition.

Figure 5:
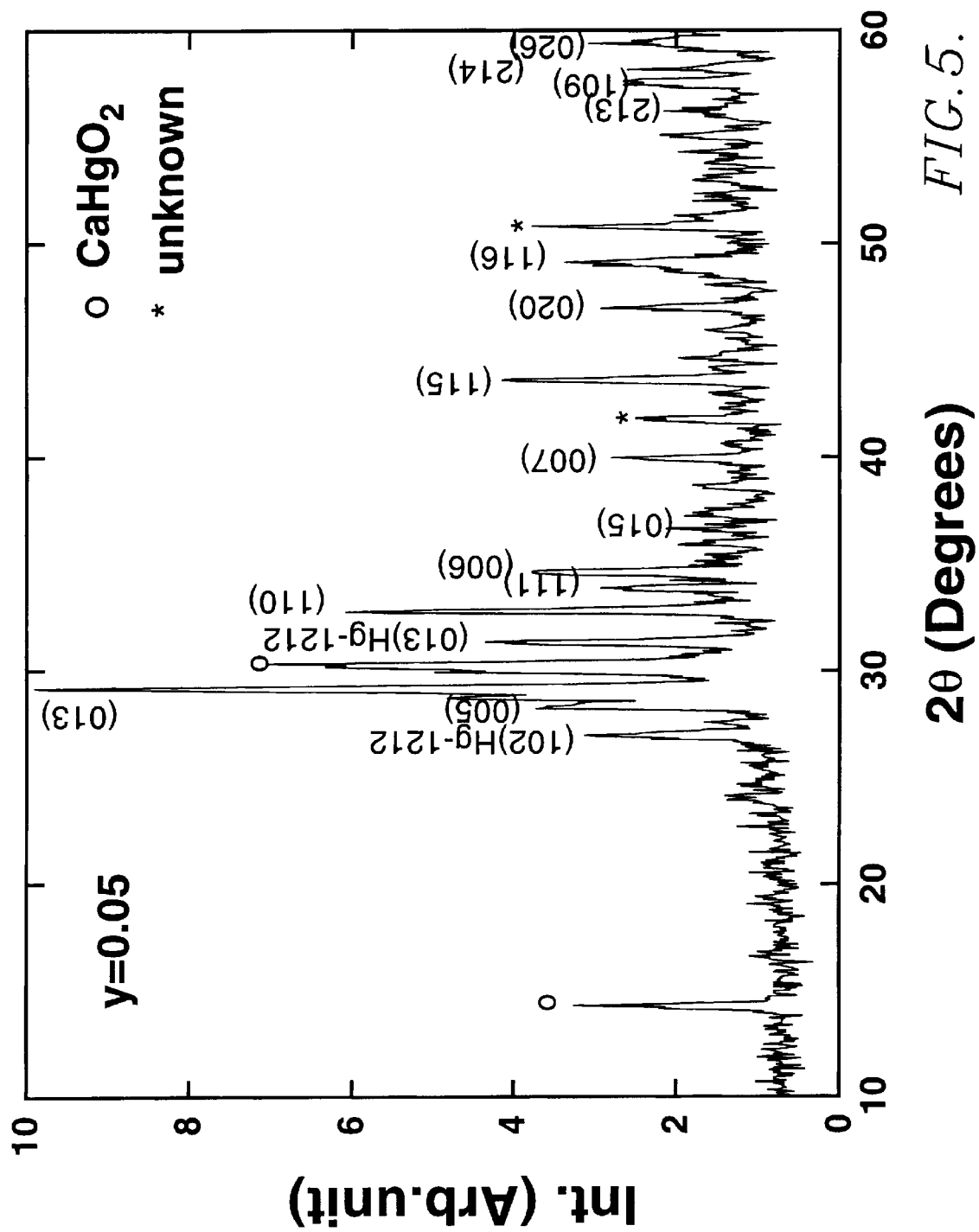
FIG. 5 is a powder X-ray diffraction graph of a 5% Na-doped Hg-1223 superconductor in accordance with the invention with certain phases labeled.
Figure 6:
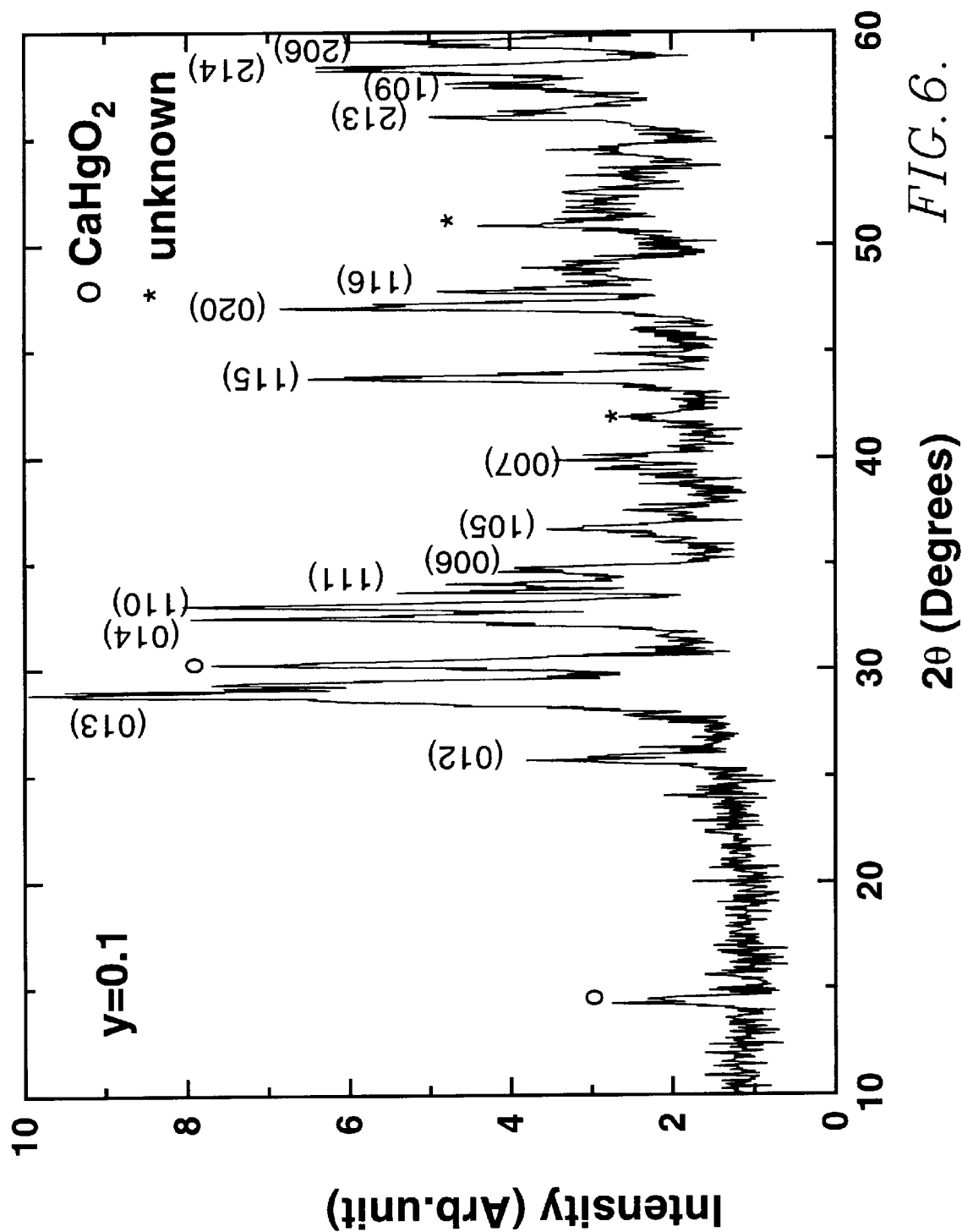
FIG. 6 is a powder X-ray diffraction graph of a 10% Na-doped Hg-1223 superconductor in accordance with the invention with certain phases labeled.

The chemical compositions of the samples were analyzed using powder X-ray diffraction on a Philip PW 1830 diffractometer with a step size of 0.050° and a scan speed of 0.05°/sec. As shown in FIGS. 5–6, the dominant phase for both y=0.05 (FIG. 5) and y=0.1 (FIG. 6) have a structure similar to that of the Hg-1223 phase. The lattice constants are calculated from the XRD patterns as a=3.856 Å and c=15.805 Å for y=0.05 and a=3.847 Å and c=15.816 Å for y=0.1. These values are comparable with the published lattice constants of a=3.845 Å and c=15.797 Å for pure Hg-1223 phase. In the case of y=0.05, two known impurity phases were observed: Hg-1212 and $CaHgO_2$ as labeled by open circles. The starred peaks represent unknown impurities. The content of the Hg-1212 impurity phase in the y=0.05 samples is estimated to be less than 30% using the (013) peaks from both Hg-1212 and Hg-1223 phases. In the case of the y=0.1 samples, no Hg-1212 peaks are visible while $CaHgO_2$ is still the major impurity (which is possibly caused by the detrimental effect of air during sample preparation).

Figure 7:
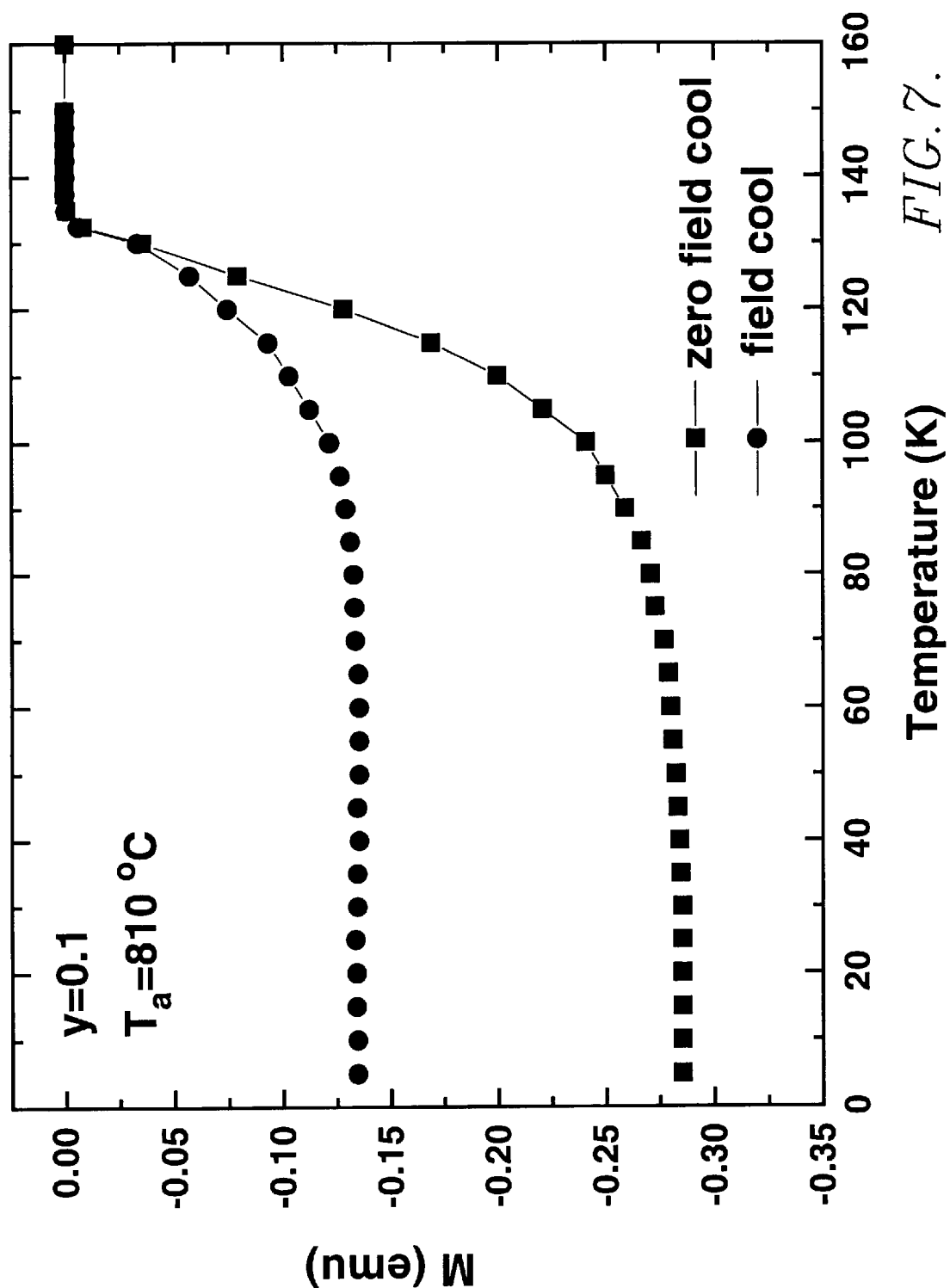
FIG. 7 is a magnetization vs. temperature curve of the Na-doped superconductor of FIG. 2 (10% Na-doped Hg-1223)

The magnetization (M) of the y=0.1 sample of FIG. 2 was measured in a 3 Oe applied magnetic field in both field-cool and zero-field-cool modes, and these results are shown in FIG. 7. A transition temperature at around 135K was observed which is slightly higher than that seen in the transport measurement. Assuming a complete Meissner effect it low temperature, the superconducting phase volume portion was estimated to be less than 70% from the zero-field-cool curve and higher than 42% from the field-cool curve.

The y=0.15 and 0.2 samples exhibited no superconducting properties, and in fact were insulators. This indicated a critical upper limit in the amount of sodium doping which could be accommodated and still obtain high $T_c$ superconductors.

The irreversibility line ($H_{irr}$) of a high $T_c$ superconductor separates the irreversible region from the reversible region in the H/T phase space. This line sets the upper H/T limit for most applications of high $T_c$ superconductors while the exponent n is found depending an the anisotropy of the material. For a less anisotropic system such as YBCO n~1.5 and for a highly anisotropic system such as Bi-Tl-based systems, n~5.5. The higher the exponent n, the lower the irreversibility line, which limits practical applications. For Hg-1212 and Hg-122 systems, the exponent n is found to be ~2.5 which suggests a superior property for various devices, such as in large current applications.

Figure 8:
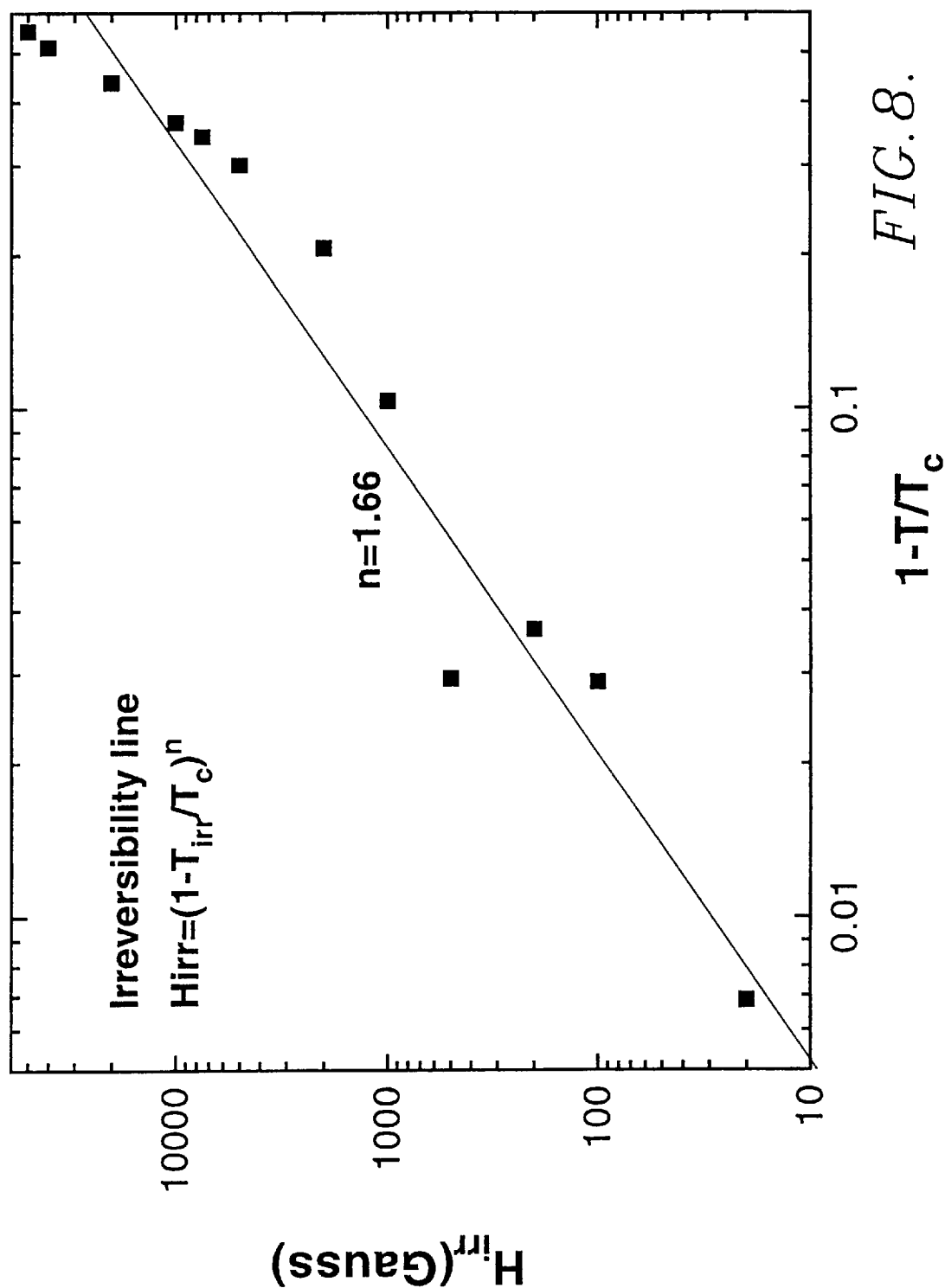
FIG. 8 is a graph of $H_{irr}$ vs. 1-$T/T_c$ for a 10% Na-doped Hg-1223 superconductor, and further showing the derived irreversibility line for the superconductor.

With Na doping of y=0.1, the exponent n in the irreversibility line can be further increased to n ~1.66 as shown in FIG. 8. This is close to the highest reported irreversibility line (on YBCO superconductors) to date. This high irreversibility line plus the record high $T_c$ in Na-doped Hg-1223 phase establishes the unique nature of the present superconductors.

Figure 9:
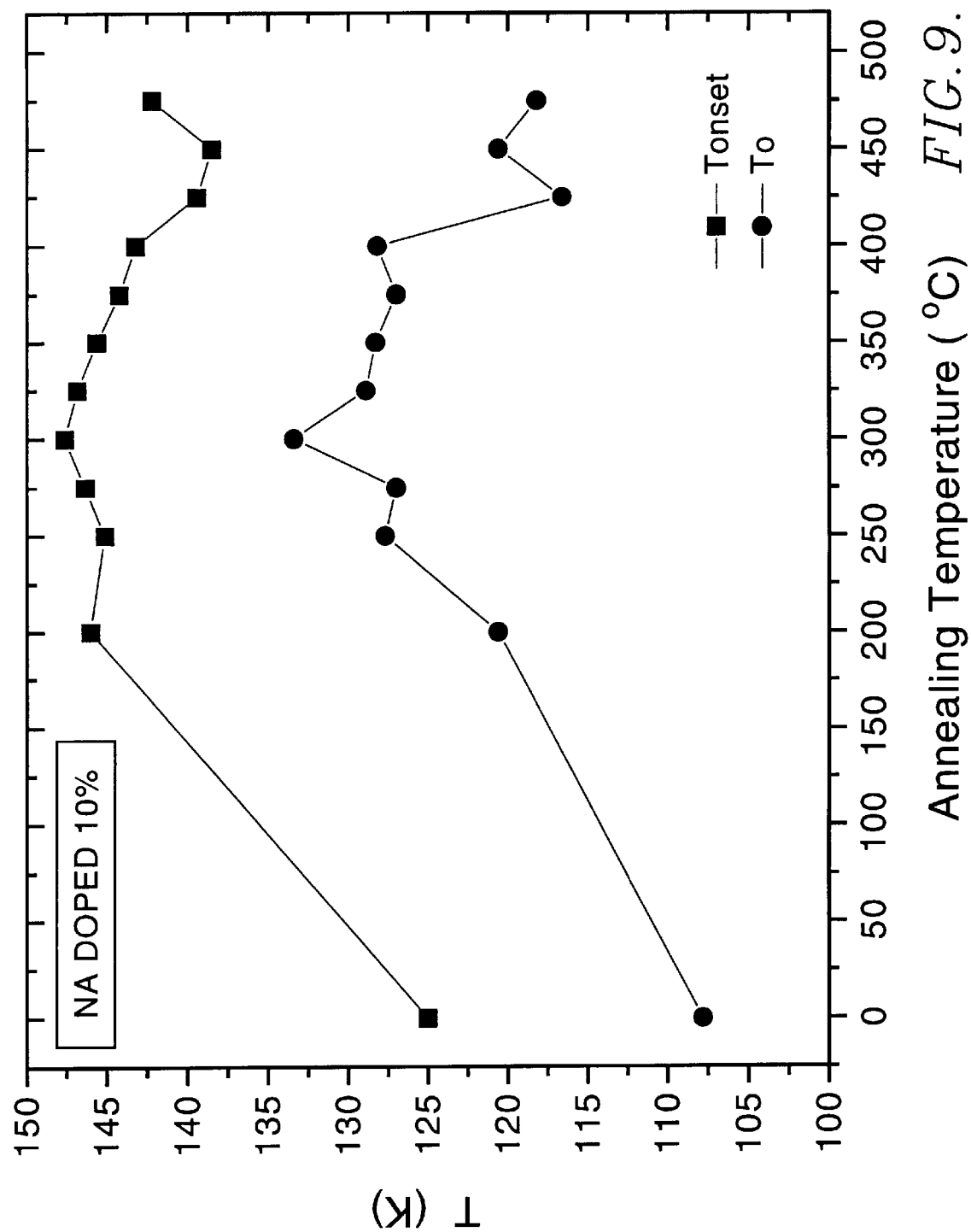
FIG. 9 is a graph of temperature (K) vs. oxygen annealing temperature for 10% Na-doped Hg-1223 superconductors secondarily annealed in oxygen at varying temperatures for 10 hours and demonstrating the effect of oxygen annealing on $T_{c\ onset}$ and $T_c$ =O values.

Low level Na doping in Hg-1123 phase renders the superconductivity of the material more sensitive to the oxygen content. Before oxygen annealing, the onset of superconducting transition ($T_{c\ onset}$) is near 125K and zero resistance temperature ($T_{cO}$) is near 107.5K (shown at zero annealing temperature) for the y=0.1 Na-doped superconductor (FIG. 9). 200° C. oxygen annealing for 10 hours raised the $T_{c\ onset}$ to 146K and $T_c$ to 121 K. As shown in FIG. 9, a variety of oxygen annealing temperatures can influence the $T_{c\ onset}$ and $T_{cO}$ values, with the highest such values being found at around 275°–350° C. oxygen annealing temperature.

The mechanism of the sodium doping effect in Hg-1223 phase is not yet clear. Two possibilities might be considered: formation of new superconducting phase, and sodium-assisted growth of Hg-1223 phase. In the former case, sodium should enter the crystal lattice, while in the latter it may only stay as an interstitial ingredient. Since the atomic, size of the Na is much smaller than that of others in Hg-1223, lattice contraction might be induced if sodium entered the lattice. This conflicts with the XRD data which shows almost identical lattice constants, for both cases of y=0.05 and y=0.1, to that of the undoped Hg1223 phase. Furthermore, no Na can be identified in the study of high resolution transmission electron microscopy (HRTEM) and energy dispersive X-ray spectroscopy (EDS). The HRTEM/ EDS analysis identifies structures and compositions similar to Hg-1223, Hg-1212, $CaHgO_2$ and other Ba-Cu compounds which consists with the XRD result. Even though the crystalline structure of the sodium-doped Hg-1223 looks the same as that of the undoped Hg-1223, differences in the electrical transport properties have been noticed between them. First of all, the slope of the normal-state R versus T curve decreases with the content of sodium and an insulating behavior is resulted as y is more than 0.1. Second, this slope decreases after low temperature oxygen annealing while $T_c$ and resistivity increase. If, as for the undoped Hg-1223 phase, more oxygen is brought into the Hg-O layer during this oxygen annealing, this may indicate that sodium stays as an interstitial near the Hg-O layer. On one hand, the presence of these interstitials may affect the local distribution of the oxygen in the Hg-O layer which could account for the different slopes in the R versus T curves of the sodium-doped Hg-1223. On the other hand, as the amount of the oxygen in the Hg-O varies during the oxygen annealing, the distribution of the sodium may also be modified since interstitials presumably have fairly low binding energy which could be comparable to the oxygen annealing temperature of 350° C. This could then explain while $T_c$ is increased with oxygen being annealed in the resistivity also increases caused by competition of increase of charge carrier density due to oxygen optimization and redistribution of sodium as scattering center for the charge carrier or formulation of $Na_2O$. Finally, it should also be noted that these sodium interstitials promotes formation of Hg-1223 phase at much lower temperatures than that required for the undoped Hg-1223 phase.

We claim:

1. An alkaline-doped superconductor of the formula $$HgM_2Ca_2Cu_3O_{8+\alpha}$$

where M is selected from the group consisting of Ba, Sr, and mixtures thereof, and a ranges from 0 to about 0.2, and being doped with a dopant selected from the group consisting of Na and Li up to a level of about 12 molar percent, based upon the amount of Hg taken as 100%.

2. The alkaline-doped superconductor of claim 1, having a $T_{c\ onset}$ of at least about 140K.

3. The alkaline-doped superconductor of claim 1, said dopant level being about 10%.

4. The alkaline-doped superconductor of claim 1, said superconductor being a bulk superconductor.

5. The alkaline-doped superconductor of claim 1, said superconductor being at least about 90% pure 1223 phase.

* * * * *